US010216870B2

(12) United States Patent
Bickford et al.

(10) Patent No.: US 10,216,870 B2
(45) Date of Patent: Feb. 26, 2019

(54) METHODOLOGY TO PREVENT METAL LINES FROM CURRENT PULSE DAMAGE

(71) Applicant: INTERNATIONAL BUSINESS MACHINES CORPORATION, Armonk, NY (US)

(72) Inventors: Jeanne P. S. Bickford, Essex Junction, VT (US); Nazmul Habib, Essex Junction, VT (US); Baozhen Li, Essex Junction, VT (US); Tad J. Wilder, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 54 days.

(21) Appl. No.: 14/994,392

(22) Filed: Jan. 13, 2016

(65) Prior Publication Data

US 2017/0199949 A1  Jul. 13, 2017

(51) Int. Cl.
*G06F 9/455* (2018.01)
*G06F 17/50* (2006.01)

(52) U.S. Cl.
CPC ...... *G06F 17/5009* (2013.01); *G06F 17/5045* (2013.01)

(58) Field of Classification Search
USPC ................. 716/104, 106, 109, 113
See application file for complete search history.

(56) References Cited

U.S. PATENT DOCUMENTS

| 7,835,896 | B1 | 11/2010 | Rode |
| 8,756,559 | B2 | 6/2014 | Shroff et al. |
| 2004/0199882 | A1 | 10/2004 | Cao et al. |
| 2009/0031264 | A1 | 1/2009 | Rittman et al. |
| 2010/0095258 | A1 | 4/2010 | Yokogawa et al. |
| 2010/0131907 | A1 | 5/2010 | Weis |
| 2012/0022846 | A1* | 1/2012 | White ................. G06F 17/5068 703/14 |
| 2012/0053923 | A1 | 3/2012 | Li et al. |
| 2015/0019194 | A1 | 1/2015 | Stella et al. |
| 2015/0095873 | A1 | 4/2015 | Lin et al. |

FOREIGN PATENT DOCUMENTS

WO   2009105993 A1   9/2009

OTHER PUBLICATIONS

Klein Osowski et al., "The SEASONing Tool: A Spice Engine for Adding Soft-errors On Netlists", Department of Electrical and Computer Engineering, University of Minnesota, 2008; 12 pgs.

* cited by examiner

*Primary Examiner* — Brian Ngo
(74) *Attorney, Agent, or Firm* — Cantor Colburn LLP; Jennifer Anda

(57) ABSTRACT

A computer-implemented method for evaluating a circuit design to protect a plurality of metal connections from current pulse damage, the method includes receiving a circuit design including the plurality of metal connections and evaluating a maximum peak current of one or more of the plurality of metal connections. The method further includes determining a peak current threshold for the plurality of metal connections based on physical characteristics of the plurality of metal connection and responsive to determining that the maximum peak current of the one or more of the plurality of metal connections exceeds the peak current threshold, performing a peak current design modification to modify the plurality of metal connections in the circuit design.

13 Claims, 5 Drawing Sheets

METHODOLOGY TO PREVENT METAL LINES FROM CURRENT PULSE DAMAGE

BACKGROUND

The present disclosure relates to the protection of integrated circuits and more specifically, to preventing metal lines in integrated circuits from current pulse damage.

As technology progresses, semiconductor product device features are becoming smaller and the density of electronic devices per area is increasing. This increases the current density and total power such that the smaller wires and interconnections become more vulnerable to damage caused by current pulses. In addition, high performance electronic devices require the use of higher current pulses during operation. Current pulses cause local heating of metal lines within the electronic devices and their effects on local temperatures of these metal lines have a significant impact on a circuit's reliability. Therefore, damage caused by peak current pulses must be considered when designing devices to ensure its integrity during normal operation.

Present tools are capable of performing design simulations to check for damage caused by the currents flowing during circuit design. However these simulations are limited to currents that have high activity factors and that are highly repetitive. A technique for designing circuits operating with both high and low activity factors is needed in order to provide protection from peak current pulses.

SUMMARY

In accordance with an embodiment of the invention, a computer-implemented method for evaluating a circuit design to protect a plurality of metal connections from current pulse damage is shown. The method includes receiving a circuit design including the plurality of metal connections and evaluating a maximum peak current of one or more of the plurality of metal connections. The method further includes determining a peak current threshold for the plurality of metal connections based on physical characteristics of the plurality of metal connections and responsive to determining that the maximum peak current of the one or more of the plurality of metal connections exceeds the peak current threshold, performing a peak current design modification to modify the plurality of metal connections in the circuit design.

In accordance with another embodiment of the invention, a system for evaluating a circuit design to protect a plurality of metal connections from current pulse damage is shown. The system includes a memory and a processor, where the system receives a circuit design including a plurality of metal connections and evaluates a maximum peak current of the plurality of metal connections. The system further determines a peak current threshold based on the physical characteristics of the plurality of metal connections and responsive to determining that the maximum peak current of the one or more of the plurality of metal connections exceeds the peak current threshold, performing a peak current design modification to modify the plurality of metal connections in the circuit design.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

In accordance with exemplary embodiments of the disclosure, a method and system for a methodology to prevent metal lines from current pulse damage is provided. Challenges exist when using peak current limits to design integrated circuits when activity factors become very small. As the activity factor decreases, peak current limits become very high. In addition, when the activity factor becomes sufficiently small, the rms (root-mean-square) limits become "not valid," and neither rms limits nor peak current limits can protect the metal lines of the circuit from instant damage caused by the local joule heating from the current pulse. Therefore a technique is needed to design and protect wires of integrated circuits operating with both high and low activity factors. There is currently no methodology for addressing peak currents with low activity factors. This method will address foregoing issues.

Figure 1:
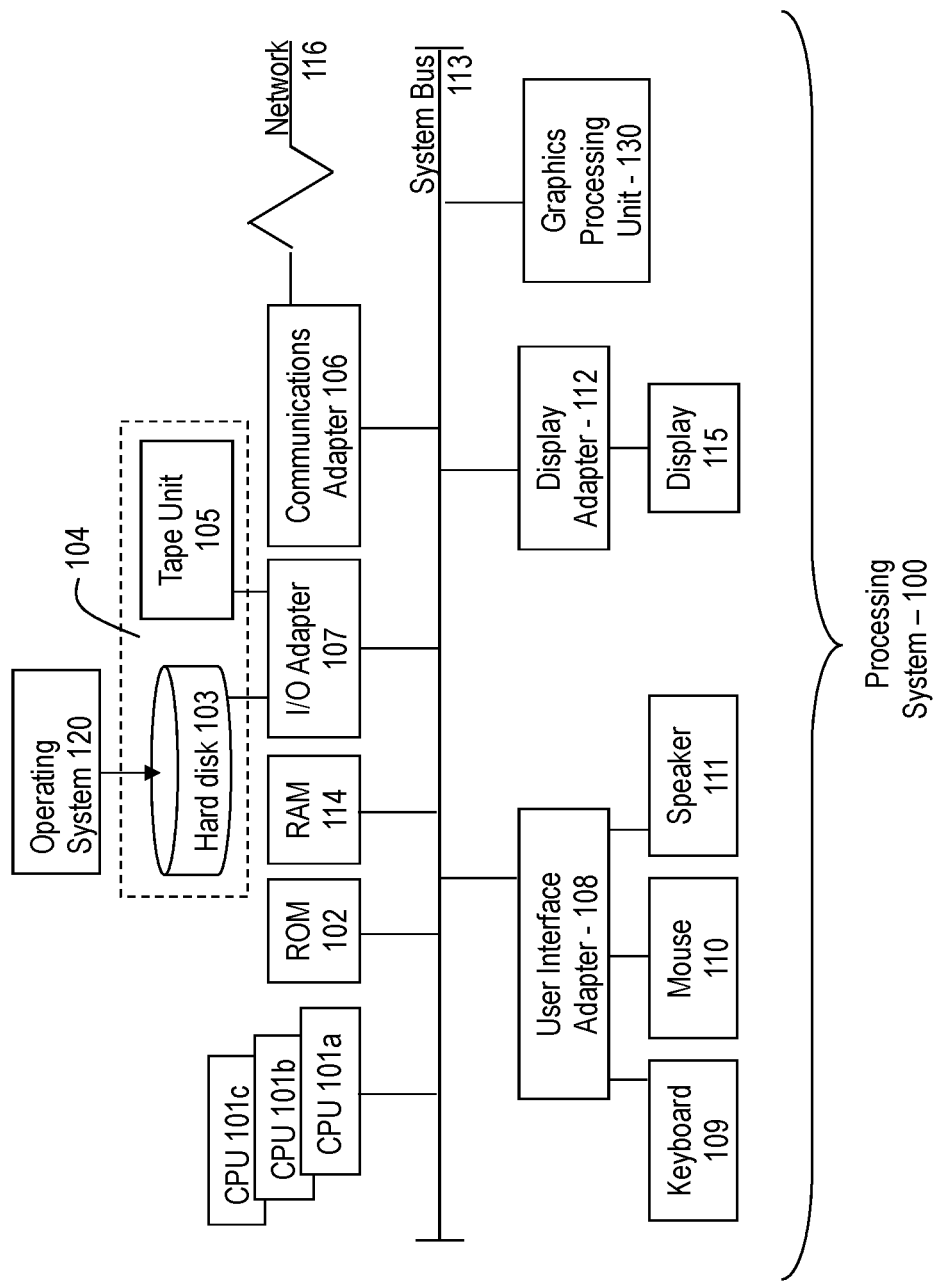
FIG. 1 is a block diagram illustrating one example of a processing system for practice of the teachings herein.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the processing system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing, and has a highly parallel structure that makes it more effective than general-purpose CPUs for algorithms where processing of large blocks of data is done in parallel.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system to coordinate the functions of the various components shown in FIG. 1.

Figures 2A, 2B:
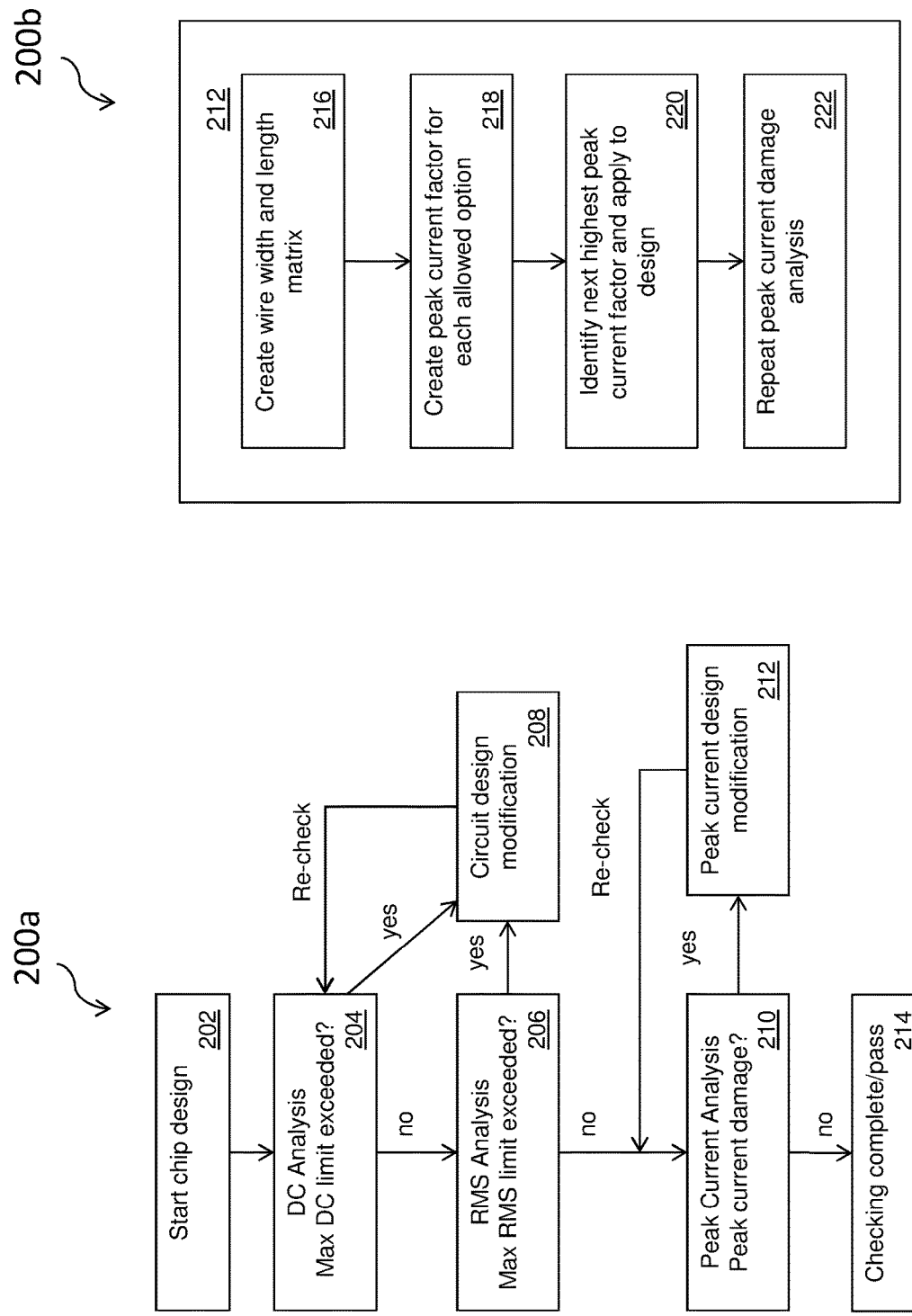
FIG. 2a is a flow diagram illustrating a methodology to prevent metal lines from current pulse damage in accordance with an exemplary embodiment.
FIG. 2b is a flow diagram illustrating a peak current design modification in accordance with an exemplary embodiment.

As illustrated in FIG. 2a, a block diagram depicting a process for designing an integrated circuit (IC) or chip and preventing the metal connections of the integrated circuit from current pulse damage is provided. The metal connections of the circuit include metal lines, wires, interconnections, vias, etc. As shown in block 202, the chip design process has started and continues to block 204 which depicts a direct current (DC) analysis where the maximum DC limit for the wires of the circuit design is determined. If the current of one of the plurality of wires of the circuit design exceeds the maximum DC limit, the circuit design will be modified as shown in block 208. After the design is modified in block 208, a recheck of the circuit design is performed under the DC analysis of block 204.

As an example the physical characteristics of the wires are modified to bring the IC design within the DC limit, where the physical characteristics include the geometry of the wires such as width and height. In addition, other physical characteristics include the type of metal such as copper, gold, silver, etc. The physical characteristics of the wires determine the current that is allowed to flow in the circuit without causing reliability concerns to the circuit.

If the current flowing in the circuit being designed does not exceed the DC limit in block 204 the process continues to block 206. Block 206 depicts a root-mean-square (rms) analysis of the current in the circuit design. The rms currents of the circuit design are computed and compared to an rms limit. If the rms limit has been exceeded the process performs a design modification as shown in block 208. After the circuit design is modified the process repeats the DC analysis of block 204 and the rms analysis of 206 until a successful design is determined.

After successfully designing the circuit the process advances to block 210. Block 210 depicts a peak current analysis to determine if peak current (Ipeak) damage exists in the circuit design. If block 210 reveals the present design results in peak current damage, the process moves to block 212 which shows a peak current design modification process. In an exemplary embodiment, detection of peak current damage at block 210 does not require the DC analysis of block 204 and rms analysis of block 206 to be repeated. After the peak current design modification of block 212 is conducted the peak current analysis of block 210 is repeated to determine if peak current damage still exists in the design.

As shown in block 212, peak current design modification is executed to determine a circuit design that will protect the wires from peak current damage. In an exemplary embodiment the wires are designed in such a manner to provide protection to current pulses having both high and low activity factors. Block 216 of FIG. 2b illustrates the generation of a wire width and length matrix which is similar to the matrix illustrated in FIG. 5 to be discussed later. As shown in block 218 a peak current factor is determined for each of the options based on the wire width and height, and the peak current factor is created based on the wire width and the wire height. In an exemplary embodiment the smallest peak current factor is selected and applied to the circuit design in block 220. After the wires of the circuit design are adjusted by the selected peak current factor, the peak current damage analysis is repeated as depicted in block 222. In an exemplary embodiment, if peak current damage still exists the process continues to block 212 to modify the design according to the next highest peak current factor. As shown in the illustration, there is no need to reanalyze the DC limit or rms limit of blocks 204 and 206 respectively. The application of the peak current factor to the design is needed to ensure the wires of the integrated circuit are protected from damage caused by current pulses. Once peak current damage is determined to be in compliance with the design requirements the process advances to block 214, and a proper circuit design is determined for the integrated circuit.

Figure 3:
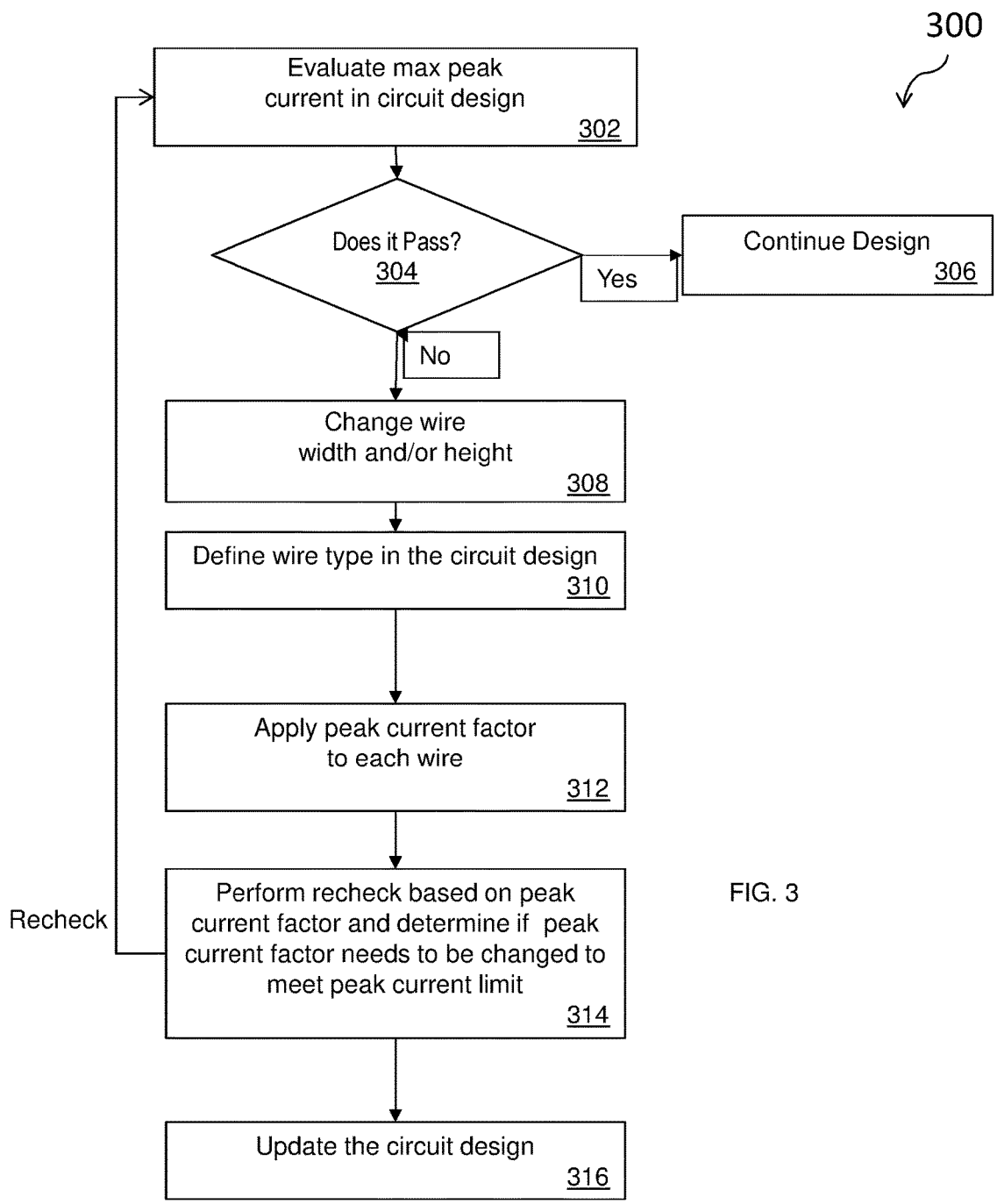
FIG. 3 is a flow diagram illustrating a methodology to prevent metal lines from current pulse damage in accordance with an exemplary embodiment.

Now referring to FIG. 3, a technique in accordance with an embodiment for designing a circuit to provide protection against current pulses is provided. As shown in block 302, the circuit design is evaluated to determine the maximum peak current. At block 304 a determination is made whether a violation exists in the circuit design. If no violation results from the present design the process advances to block 306 to continue designing the circuit. However if peak current damage is determined to occur at block 304, the process advances to block 308 to change the wire width and/or height.

At block 308, if the wire width and/or height is changed the wire type must be defined as shown in block 310. After defining the wire type, a peak current factor from the wire width and thickness matrix is selected and applied to each wire as shown in block 312. Block 314 depicts determining the peak current factor needed to bring the circuit design in compliance with the peak current limit. As shown in block 316, the wiring of the circuit design is modified according to the selected peak current factor.

After applying the selected peak current factor to the circuit design, the process repeats (continues to block 302) the peak current damage analysis until a satisfactory design is determined. In an exemplary embodiment, if the process is repeated due to the existence of peak current damage, the next highest peak current factor is selected. The selected peak current factor will be applied to the wires and a recheck will be performed until a satisfactory circuit design is determined.

Figure 4:
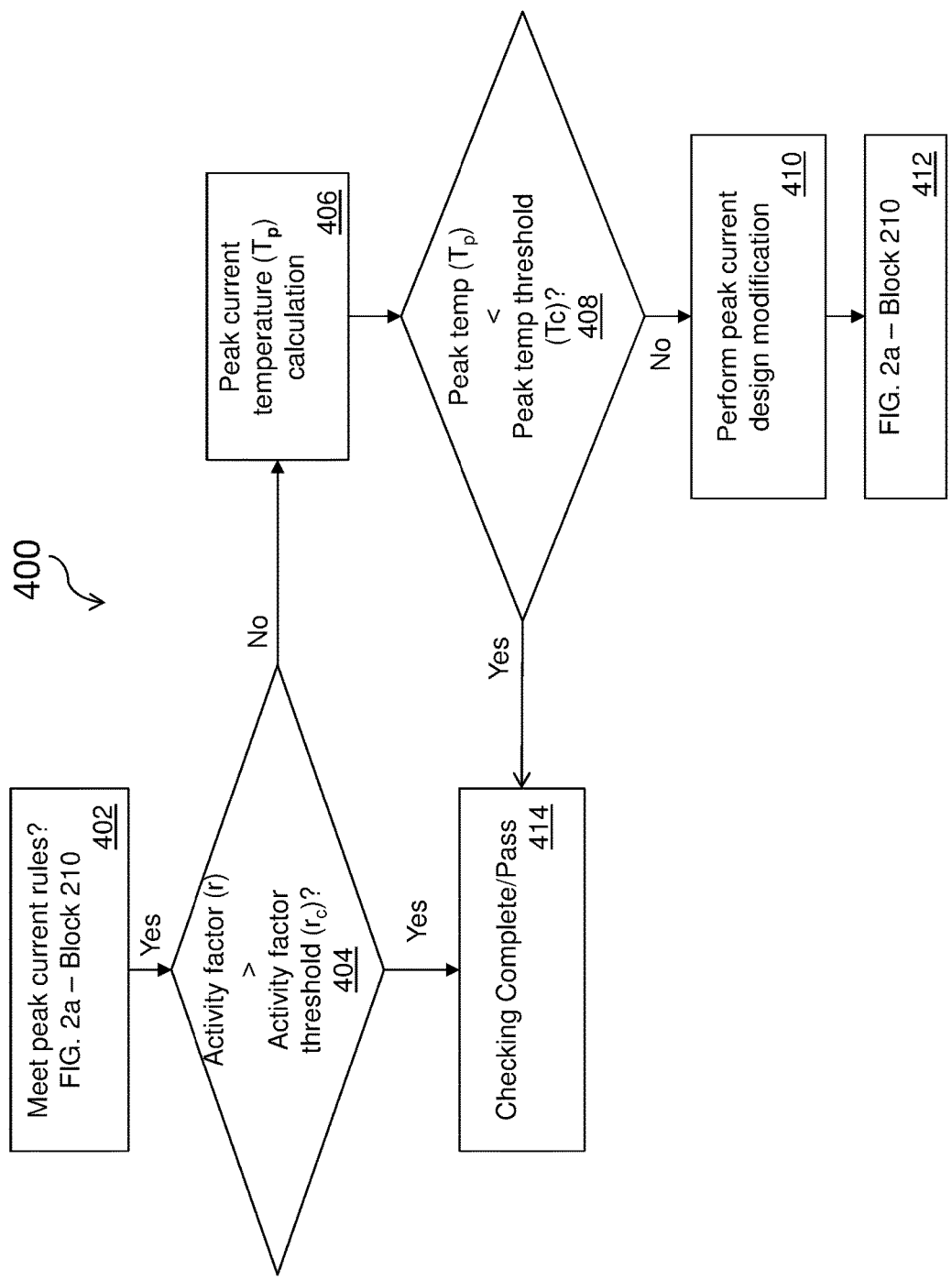
FIG. 4 is a flow diagram illustrating a flow diagram illustrating a methodology to prevent metal lines from current pulse damage in accordance with an exemplary embodiment.

As shown in FIG. 4, a method for protecting metal connections from current pulse damage is provided. In an exemplary embodiment using peak temperature to determine if Ipeak (peak current) damage occurs is advantageous when the activity factor becomes small. As the activity factor becomes smaller the peak current limit becomes very high. As the peak current increases damage to the metal lines and vias from the joule heating caused by the peak currents will occur. Directly calculating the peak temperature of the wires can account for damage caused by peak currents having low activity factors and can be used to protect circuits from peak current damage. The following equations provide a calculation for determining peak temperature of a metal wire.

The following equation can be used to calculate heat generation (per unit length) for a current I passing through a metal line:

$$Q = I^2 R[T] t = j_p^2 \rho_0 t (1 + \beta^* \Delta T)^* (h^* w)$$

where I—current, R[T]—resistance as a function of temperature (T), h—height of the wire, w-width of the wire, t—time, $\rho$—metal specific weight, $j_p$—peak current density, $\beta$—wire temperature coefficient of resistance The following equation can be used to calculate energy (per unit length) needed to heat a metal line by $\Delta T$:

$$E_t = C_t \rho_t {}^* h^* w^* \Delta T$$

Depending on the current pulse width, the process may not be treated as adiabatic, therefore we introduce a heat loss factor $\alpha$. The equation regarding energy conservation becomes:

$$Q(1-\alpha) = E_t$$

Solving the above equations for peak temperature provides:

$$T_p = \frac{t(-1+\alpha)j_p^2(-1+\beta T_j)\rho_0 + C_t T_j \rho_t}{t(-1+\alpha)\beta j_p^2 \rho_0 + C_t \rho_t}$$

Where $T_p$—local instant temperature; $T_c$—threshold local instant temperature; $r_c$—threshold activity factor, where $j_p$—peak height of current density, $\beta$—metal temperature coefficient of resistance, $\rho_t$—Metal specific weight, $C_t$—metal specific heat capacity, $T_j$—nominal junction temperature; $\alpha$—heat loss fraction (0-1), when peak width is <10 nanoseconds, $\alpha$ is close to 0. $T_c$ and $r_c$ (in FIG. 4) are predefined based on technology node and metal level.

In an exemplary embodiment the threshold local instant temperature ($T_c$) is based on the melting point of the wire material and the characterization results from technology qualifications. For example, the threshold local temperature can be 40% of the melting point of copper or a range between 30-60%. When the peak temperature threshold is exceeded, damage to the wire will result which can lead to failure of the IC. The threshold is selected to ensure the integrity of the wire during operation.

Now referring to FIG. 4, a technique for designing the wires of the IC having a low activity factor is shown. As shown in block 402, the peak current rules and requirements of the design are checked. Following this check the process continues to block 404. The activity factor ("r") is a ratio of the duration the current pulse over the period of the signal. The activity factor for the current pulse duration is determined and block 404 shows determining the activity factor of the current duration is less than an activity factor threshold ("rc"). If the activity factor of the current exceeds the activity factor threshold, the process advances to block 414 and is completed. In an exemplary embodiment the activity factor threshold can range between 0.05-0.2. The activity factor threshold can be configured based on the requirements of the circuit design, and the characterization results from technology qualifications. As shown in block 406, the peak temperature ("Tp") calculation for the metal wires is performed. In an exemplary embodiment, the peak temperatures for the wires are determined according to the peak temperature equation shown above. In block 408 the peak temperature of the circuit design is compared to the peak temperature threshold ('Tc") and if it is determined that the peak temperature threshold has been exceeded, the peak current design modification of FIG. 3 is conducted as shown in block 410. If the peak temperature threshold has not been exceeded the process continues to block 414 indicating the circuit design is satisfactory and the checking process is complete. After performing the peak current design modification, a recheck for peak current damage is performed as shown in block 412 and the process continues to FIG. 2 block 210. This process may be repeated until a satisfactory circuit design is determined.

Figure 5:
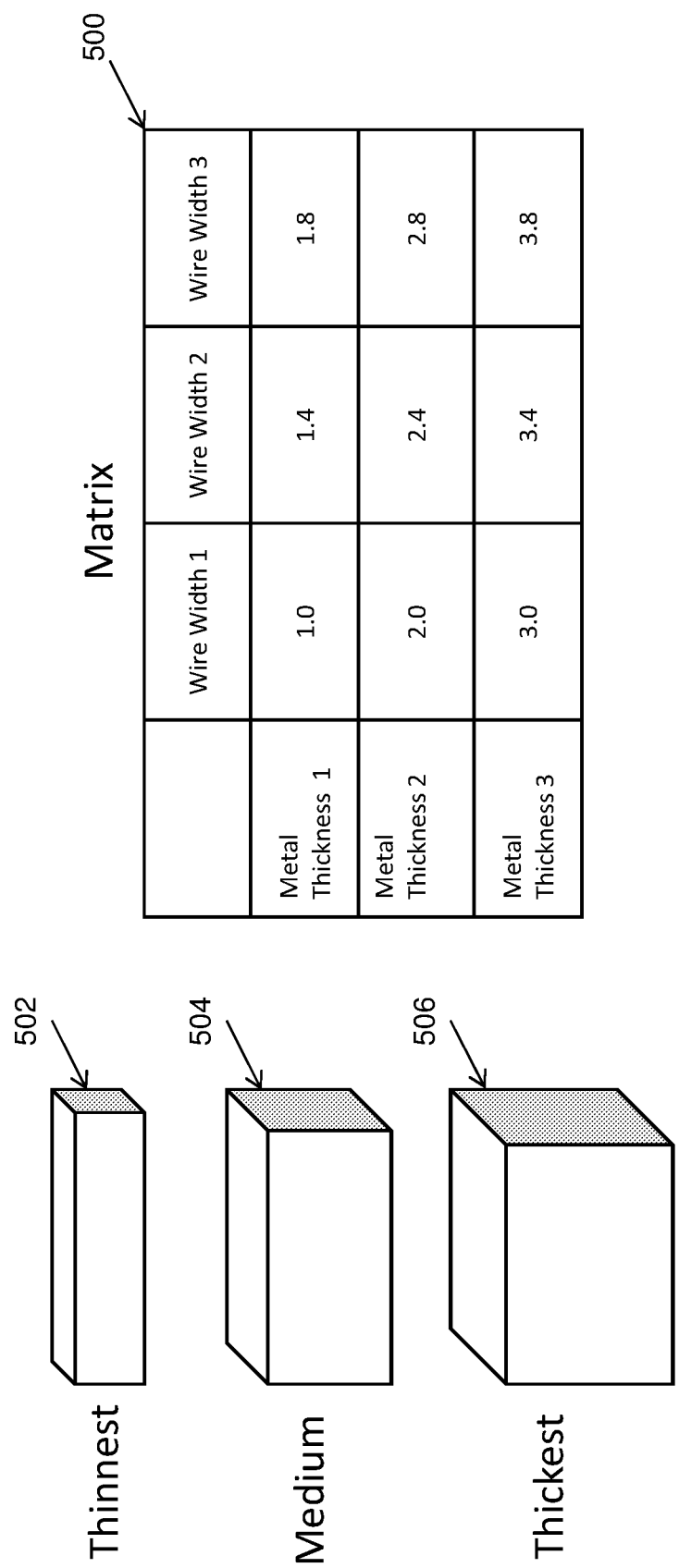
FIG. 5 is a diagram illustrating a width and thickness matrix in accordance with an exemplary embodiment.

Referring now to FIG. 5, a wire width and thickness matrix is provided. The matrix includes values that are referred to as peak current factors for the metal cross-sections of the wires to be used in the circuit design. Wires having different metal widths and heights have different peak current factors. As an example, FIG. 5 illustrates three different thickness levels for defining the wire types of a circuit design, "thinnest," "medium," and "thickest" (elements 502, 504, 506, respectively) which may be selected based on the technology requirements of the IC. Peak current factors are used to modify the wires in the circuit design in order to prevent damage caused by high current pulses and local heating of the wires. In an exemplary embodiment the peak current design modification begins with the smallest peak current factor and increases to the next highest peak current factor when repeating the check for peak current damage results in a failure. For example, the peak current factor "1.0" can be selected from matrix 500 based on the defined wire type, and the peak current damage analysis is repeated according to the selected peak current factor. If peak current damage is detected, the next highest peak current factor to be selected is "1.4." It will be applied to the wires of the circuit design and the peak current analysis will be performed again. This process will be repeated until a satisfactory circuit design is determined.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed:

1. A computer-implemented method for evaluating a circuit design to protect a plurality of metal connections from peak current damage, the method comprising:
   receiving a circuit design including the plurality of metal connections;
   evaluating a peak current of one or more of the plurality of metal connections;
   determining a peak current threshold for the plurality of metal connections based on physical characteristics of the plurality of metal connections;
   responsive to determining that the peak current of the one or more of the plurality of metal connections exceeds the peak current threshold, performing a peak current design modification to modify the plurality of metal connections in the circuit design; wherein the performing the peak current design modification comprises:
      defining a metal connection type in the circuit design by width and height;
      determining a peak current factor from a metal connection width and thickness matrix associated with the plurality of metal connections having the peak current;
      selecting the peak current factor based on the defined metal connections type;
      applying the selected peak current factor to the plurality of metal connections and repeating a check for peak current damage to determine if peak current damage still exists in the circuit design;

updating the plurality of metal connections in the circuit design based on the determined peak current factor;

wherein the selecting the peak current factor begins with the smallest peak current factor of the metal connection width and thickness matrix for the defined connection type and selecting a next highest peak current factor in the matrix until peak current damage no longer exists; and operating a circuit based at least in part on the circuit design using the determined peak current factor.

2. The method of claim 1, wherein the peak current design modification, comprises:

generating a metal connection width and thickness matrix;

creating a peak current factor for each option of the matrix;

selecting a peak current factor for modifying the plurality of metal connections;

re-evaluating the peak current of the one or more of the plurality of metal connections based on the selected peak current factor;

responsive to determining the re-evaluated peak current exceeds the peak current threshold, repeating the peak current design modification.

3. The method of claim 1, wherein the peak current factor represents a function of the height and width of a metal connection to be used in the circuit design.

4. The method of claim 1, determining an activity factor for the peak current of the plurality of metal connections is less than an activity factor threshold;

responsive to determining the activity factor is less than the activity factor threshold, calculating a peak current temperature associated with the plurality of metal connections to determine if the peak temperature is less than or equal to a peak temperature threshold; and responsive to determining the peak current temperature is greater than the peak temperature threshold, performing the peak current design modification.

5. The method of claim 4, further comprises:

performing a root-mean-square (rms) analysis to determine whether the circuit design has exceeded an rms current limit;

performing a direct current (dc) analysis to determine whether the metal connections have exceeded a dc limit;

if the dc limit or the rms limit has been exceeded performing a circuit design modification; and performing the evaluating the peak current after the rms limit and dc limit have been satisfied.

6. The method of claim 5, wherein the circuit design modification includes modifying physical characteristics of the plurality of metal connections in order to meet the rms limit and dc limit of the circuit design.

7. A system for evaluating a circuit design to protect a plurality of metal connections from current pulse damage, the system comprising:

a memory;

a processor, wherein the system receives a circuit design including a plurality of metal connections;

evaluates a peak current of the plurality of metal connections;

determines a peak current threshold based on physical characteristics of the plurality of metal connections;

responsive to determining that the peak current of the one or more of the plurality of metal connections exceeds the peak current threshold, performing a peak current design modification to modify the plurality of metal connections in the circuit design; wherein the peak current design modification, comprises:

generating a metal connection width and thickness matrix;

creating a peak current factor for each option of the matrix;

selecting a peak current factor for modifying the plurality of metal connections;

re-evaluating the peak current of the one or more of the plurality of metal connections based on the selected peak current factor;

responsive to determining the re-evaluated peak current exceeds the peak current threshold, repeating the peak current design modification;

wherein the selecting the peak current factor begins with the smallest peak current factor of the metal connection width and thickness matrix for a defined connection type and selecting a next highest peak current factor in the matrix until peak current damage no longer exists; and operating a circuit based at least in part on the circuit design using the determined peak current factor.

8. The system of claim 7, wherein the performing the peak current design modification comprises:

defining a metal connection type in the circuit design by width and height;

determining a peak current factor from a metal connection width and thickness matrix associated with the plurality of metal connections having the peak current;

selecting the peak current factor based on the defined metal connection type;

applying the selected peak current factor to the plurality of metal connections and repeating a check for peak current damage to determine if peak current damage still exists in the circuit design; and updating the plurality of metal connections in the circuit design based on the determined peak current factor.

9. The system of claim 7, wherein the peak current factor represents a function of a height and a width of a metal connection to be used in the circuit design.

10. The system of claim 7, determining an activity factor of the peak current of the plurality of metal connections is less than an activity factor threshold;

responsive to determining the activity factor is less than the activity factor threshold, calculating a peak current temperature associated with the plurality of metal connections to determine if the peak temperature is less than or equal to a peak temperature threshold; and responsive to determining the peak current temperature is greater than the peak temperature threshold, performing the peak current design modification.

11. The system of claim 10, further comprises:

performing a root-mean-square (rms) analysis to determine whether the circuit design has exceeded an rms current limit;

performing a direct current (dc) analysis to determine whether the circuit design has exceeded a dc limit;

if the dc limit or the rms limit has been exceeded performing a circuit design modification; and performing the evaluating the peak current after the rms limit and dc limit have been satisfied.

12. The system of claim 11, wherein the circuit design modification includes modifying physical characteristics of the plurality of metal connections in order to meet the rms limit and dc limit of the circuit design.

13. A computer-implemented method for evaluating a circuit design to protect a plurality of metal connections from peak current damage, the method comprising:
- receiving a circuit design including the plurality of metal connections;
- evaluating a peak current of one or more of the plurality of metal connections;
- determining a peak current threshold for the plurality of metal connections based on physical characteristics of the plurality of metal connections;
- responsive to determining that the peak current of the one or more of the plurality of metal connections exceeds the peak current threshold, performing a peak current design modification to modify the plurality of metal connections in the circuit design, wherein the performing the peak current design modification comprises:
    - defining a metal connection type in the circuit design by width and height;
    - determining a peak current factor from a metal connection width and thickness matrix associated with the plurality of metal connections having the peak current;
- selecting the peak current factor based on the defined metal connections type;
- applying the selected peak current factor to the plurality of metal connections and repeating a check for peak current damage to determine if peak current damage still exists in the circuit design;
- updating the plurality of metal connections in the circuit design based on the determined peak current factor, wherein the selecting the peak current factor begins with the smallest peak current factor of the metal connection width and thickness matrix for the defined connection type and selecting a next highest peak current factor in the matrix until peak current damage no longer exists; and
- operating a circuit based at least in part on the circuit design using the determined peak current factor.

* * * * *